United States Patent
Xu

(10) Patent No.: US 10,020,301 B2
(45) Date of Patent: Jul. 10, 2018

(54) ARRAY SUBSTRATE AND MANUFACTURING METHOD FOR THE SAME

(71) Applicant: Shenzhen China Star Optoelectronics Technology Co., Ltd., Shenzhen, Guangdong (CN)

(72) Inventor: Hongyuan Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 48 days.

(21) Appl. No.: 15/111,442

(22) PCT Filed: Jun. 12, 2016

(86) PCT No.: PCT/CN2016/085468
§ 371 (c)(1),
(2) Date: Jul. 13, 2016

(87) PCT Pub. No.: WO2017/197678
PCT Pub. Date: Nov. 23, 2017

(65) Prior Publication Data
US 2017/0373057 A1 Dec. 28, 2017

(30) Foreign Application Priority Data
May 20, 2016 (CN) .......................... 2016 1 0340811

(51) Int. Cl.
*H01L 21/70* (2006.01)
*H01L 27/088* (2006.01)
*H01L 27/32* (2006.01)
*H01L 29/40* (2006.01)
(Continued)

(52) U.S. Cl.
CPC ........ *H01L 27/088* (2013.01); *H01L 27/3244* (2013.01); *H01L 29/401* (2013.01); *H01L 29/4232* (2013.01); *H01L 29/45* (2013.01)

(58) Field of Classification Search
CPC . H01L 27/088; H01L 27/3244; H01L 29/401; H01L 29/4232; H01L 29/45
See application file for complete search history.

(56) References Cited

U.S. PATENT DOCUMENTS

2012/0086881 A1* 4/2012 Kim .................... H01L 27/1288
349/46
2015/0132914 A1* 5/2015 Wasyluk ............. H01L 29/6656
438/287

* cited by examiner

*Primary Examiner* — Elias M Ullah
(74) *Attorney, Agent, or Firm* — Andrew C. Cheng

(57) ABSTRACT

A manufacturing method for an array substrate is disclosed. The method includes: forming a gate electrode on a substrate; depositing a gate insulation layer, a semiconductor layer, a source-drain metal layer and a passivation layer on the gate electrode and the substrate, and through a mask process to perform a patterning process to the semiconductor layer, the source-drain metal layer and the passivation layer in order to form a semiconductor pattern, a source-drain pattern and a contact hole pattern; and forming an ITO pixel electrode on the passivation layer and the contact hole pattern. An array substrate is also disclosed. The present invention adopts one mask process to form the semiconductor pattern, the source-drain pattern and the contact hole pattern such that the process of the array substrate is reduced to three masks in order to reduce the manufacturing cost, reduce the operation time and increase the production efficiency.

14 Claims, 10 Drawing Sheets

(51) Int. Cl.
*H01L 29/423* (2006.01)
*H01L 29/45* (2006.01)

ARRAY SUBSTRATE AND MANUFACTURING METHOD FOR THE SAME

BACKGROUND OF THE INVENTION

1. Field of the Invention

The present invention relates to a display technology field, and more particularly to an array substrate and a manufacturing method for the same.

2. Description of Related Art

The Liquid crystal displays (LCDs) are widely applied in a flat display device, and mainly through a liquid crystal switch to adjust the strength of the backlight source in order to realize an image display. The manufacturing process of the LCDs includes an array process. The conventional array substrate usually adopts a five-mask technology or a four mask technology. In the five-mask technology, a gate electrode, a semiconductor layer, source-drain electrodes, passivation layer and a transparent electrode layer are respectively manufactured through one mask; in the four-mask technology, the semiconductor layer and the source drain electrodes are simultaneously formed through one half-tone mask or one multi-tone mask.

In the manufacturing process of the array substrate, when the number of the masks is more, the manufacturing cost is higher, the corresponding operation time is longer and the production efficiency is lower.

SUMMARY OF THE INVENTION

The purpose of the present invention is to provide an array substrate and a manufacturing method for the same in order to solve the problems of high manufacturing cost, long operation time, and low production efficiency caused by the number of the masks is too much.

In order to realize the above purpose, the present invention provides a manufacturing method for an array substrate, comprising:

forming a gate metal layer on a substrate;

adopting a first mask process to perform a patterning process to the gate metal layer in order to form a gate electrode;

depositing a gate insulation layer, a semiconductor layer, a source-drain metal layer and a passivation layer on the gate electrode and the substrate, and through a second mask process to perform a patterning process to the semiconductor layer, the source-drain metal layer and the passivation layer in order to form a semiconductor pattern, a source-drain pattern and a contact hole pattern;

depositing an ITO conductive layer on the passivation layer; and adopting a third mask process to perform a patterning process to the ITO conductive layer in order to form the ITO pixel electrode.

In order to realize the above purpose, the present invention provides a manufacturing method for an array substrate, comprising:

forming a gate electrode on a substrate;

depositing a gate insulation layer, a semiconductor layer, a source-drain metal layer and a passivation layer on the gate electrode and the substrate, and through a mask process to perform a patterning process to the semiconductor layer, the source-drain metal layer and the passivation layer in order to form a semiconductor pattern, a source-drain pattern and a contact hole pattern; and forming an ITO pixel electrode on the passivation layer and the contact hole pattern.

Wherein, the step of depositing a gate insulation layer, a semiconductor layer, a source-drain metal layer and a passivation layer on the gate electrode and the substrate, and through a mask process to perform a patterning process to the semiconductor layer, the source-drain metal layer and the passivation layer in order to form a semiconductor pattern, a source-drain pattern and a contact hole pattern comprises:

sequentially depositing a gate insulation layer, a semiconductor layer, a source-drain metal layer on the gate electrode and the substrate, and covering with a first photoresist;

adopting a mask to perform a patterning process to the semiconductor layer, the source-drain metal layer and the first photoresist layer in order to form a semiconductor pattern, a source-drain pattern and a second photoresist, and the second photoresist is located on the source-drain metal layer;

depositing a passivation layer on the substrate, and the passivation layer covers the gate insulation layer, the semiconductor pattern, the source-drain pattern and the second photoresist; and removing the second photoresist and the passivation layer on the second photoresist in order to form a contact hole pattern.

Wherein, the step of adopting a mask to perform a patterning process to the semiconductor layer, the source-drain metal layer and the first photoresist layer in order to form a semiconductor pattern, a source-drain pattern and a second photoresist comprises:

using a mask to expose the first photoresist in order to reveal the source-drain metal layer at two terminals of the substrate, and make the first photoresist to form three different thicknesses, wherein the three different thicknesses are respectively a thickness of a first region photoresist of the first photoresist corresponding to the semiconductor pattern, a thickness of a second region photoresist of the first photoresist corresponding to the source-drain pattern and a thickness of a third region photoresist of the first photoresist corresponding to a second photoresist;

using a dry etching and a wet etching to remove an exposed portion of the source-drain metal layer and the semiconductor layer corresponding to the exposed portion of the source-drain metal layer;

performing an ashing treatment to the first photoresist in order to remove the first region photoresist corresponding to the semiconductor pattern;

using a dry etching and a wet etching to remove the source-drain metal layer corresponding to the semiconductor pattern in order to form the semiconductor pattern; and performing an ashing treatment to the second region photoresist and the third region photoresist in order to form a source-drain pattern, and the third region photoresist leaves the second photoresist.

Wherein, the mask is a multi-tone mask, and the multi-tone mask 30 has four different light transmittances.

Wherein, a light transmittance of a first portion of the multi-tone mask corresponding to a first region photoresist is less than a light transmittance of a second portion of the multi-tone mask corresponding to the second region photoresist; the light transmittance of a second portion of the multi-tone mask corresponding to the second region photoresist is less than a light transmittance of a third portion of the multi-tone mask corresponding to the third region photoresist; a remaining portion of the multi-tone mask that is a portion of the multi-tone mask except the first portion, the second portion and the third portion is a light-blocking film.

Wherein, before the step of removing the second photoresist and the passivation layer on the second photoresist in order to form a contact hole pattern, the method further comprises: using a laser to irradiate the second photoresist.

Wherein, the step of removing the second photoresist and the passivation layer on the second photoresist in order to form a contact hole pattern includes: adopting a lift-off process to remove the second photoresist and the passivation layer on the second photoresist in order to form a contact hole pattern.

Wherein, the step of sequentially depositing a gate insulation layer, a semiconductor layer, a source-drain metal layer on the gate electrode and the substrate comprises: adopting a chemical vapor deposition to sequentially deposit the gate insulation layer and the semiconductor layer on the gate electrode and the substrate; and adopting a physical vapor deposition to deposit the source-drain metal layer on the semiconductor layer.

Wherein, the step of adopting a chemical vapor deposition to sequentially deposit the gate insulation layer and the semiconductor layer on the gate electrode and the substrate includes: adopting a chemical vapor deposition to deposit an a-Si layer on the gate electrode and the substrate; and doping the a-Si layer in order to form a doped a-Si layer.

Wherein, the doped a-Si layer is an N+ doped a-Si layer.

Wherein, the step of forming an ITO pixel electrode on the passivation layer and the contact hole pattern comprises: depositing an ITO conductive layer on the passivation layer; and adopting a third mask process to perform a patterning process to the ITO conductive layer in order to form the ITO pixel electrode.

Wherein, the step of depositing an ITO conductive layer on the passivation layer comprises: adopting a physical vapor deposition to deposit the ITO conductive layer on the passivation layer.

Wherein, the third mask process is a photolithography process including developing, wet etching, and dry etching.

Wherein, the step of forming a gate electrode on a substrate comprises: forming a gate metal layer on the substrate; and using a first mask process to perform a patterning process to the gate metal layer to form the gate electrode.

Wherein, a material of the gate metal layer includes gold, silver, copper or iron.

Wherein, the first mask process is a photolithography process including developing, wet etching, and dry etching.

In order to realize the above purpose, the present invention provides an array substrate, comprising:
a substrate and a gate electrode formed on the substrate;
a gate insulation layer, a semiconductor layer, a source-drain metal layer and a passivation layer formed on the gate electrode and the substrate, and a semiconductor pattern, a source-drain pattern and a contact hole pattern formed through a mask process; and
an ITO pixel electrode formed on the contact hole pattern and the passivation layer.

Wherein, the gate electrode is formed in the process that using a first mask to perform a patterning process to a gate metal layer on the substrate.

Wherein, the ITO pixel electrode is formed in the process that using a third mask process to perform a patterning process to an ITO conductive layer on the contact hole pattern and the passivation layer.

The beneficial effects of the present invention is: comparing to the conventional art, the present invention includes the steps of forming a gate electrode on a substrate; depositing a gate insulation layer, a semiconductor layer, a source-drain metal layer and a passivation layer on the gate electrode and the substrate, and through a mask process to perform a patterning process to the semiconductor layer, the source-drain metal layer and the passivation layer in order to form a semiconductor pattern, a source-drain pattern and a contact hole pattern; and forming an ITO pixel electrode on the passivation layer and the contact hole pattern. Through above way, the present invention adopts one mask process to form the semiconductor pattern, the source-drain pattern and the contact hole pattern such that the process of the array substrate is reduced to three masks in order to reduce the manufacturing cost, reduce the operation time and increase the production efficiency.

DETAILED DESCRIPTION OF THE PREFERRED EMBODIMENT

The following content combines with the drawings and the embodiment for describing the array substrate and the manufacturing method for the same provided by the present invention in detail.

Figure 1:
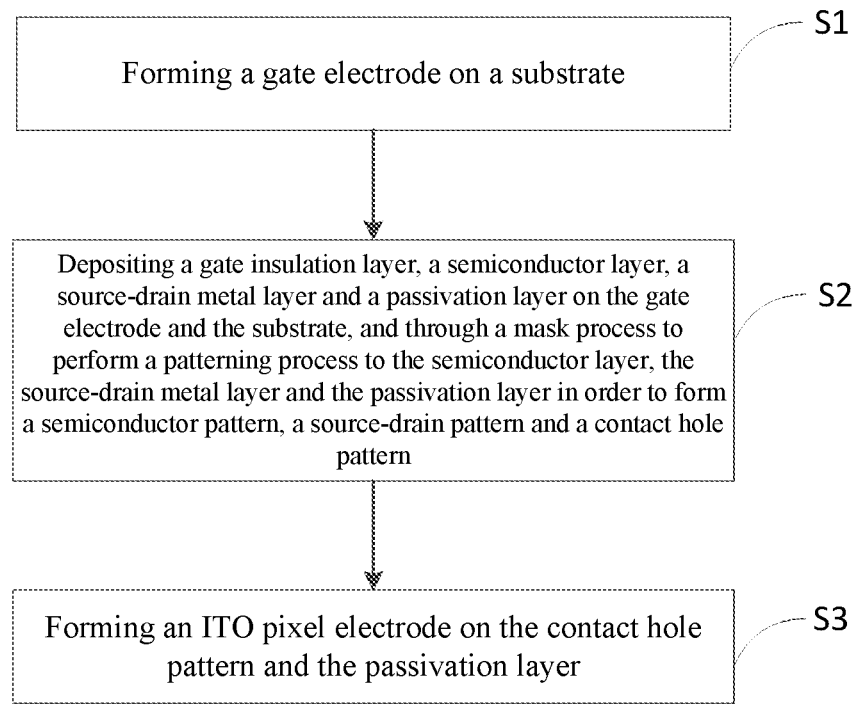
FIG. 1 is a flow chart of a first embodiment of a manufacturing method for an array substrate of the present invention.

As shown in FIG. 1, and FIG. 1 is a flow chart of a manufacturing method for an array substrate of a first embodiment of the present invention, the manufacturing method for an array substrate includes following steps:

S1: forming a gate electrode 1021 on a substrate 101;

Specifically, the substrate 101 can be made by PEN (Polyethylene naphthalene), PET (Polyethylene terephthalate), PI (Polyimide) or glass.

Figure 2:
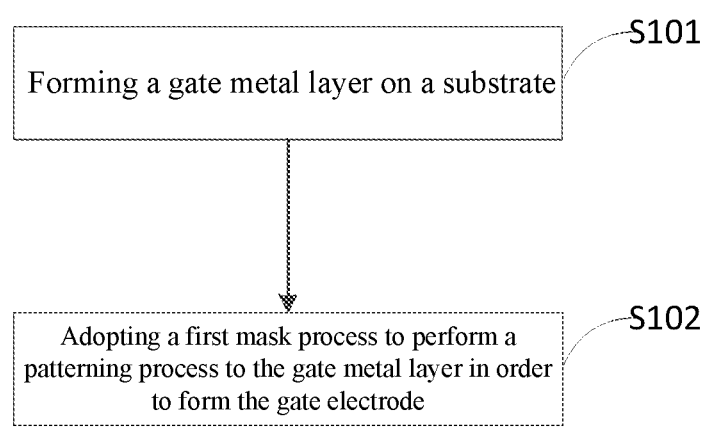
FIG. 2 is a specific flow chart of the step S1 in FIG. 1.
Figure 3A:
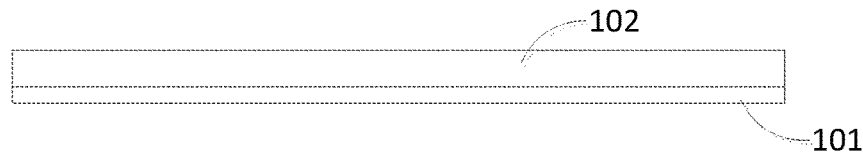
FIG. 3a-FIG. 3b is a cross-sectional view of the array substrate in each step of FIG. 2.

As shown in FIG. 2, the step specifically includes:

S101: through sputtering method to form a gate metal layer 102 on an upper surface of the substrate 101, a material of the gate metal layer 102 includes but not limited to gold, silver, copper or iron, with reference to FIG. 3a:

S102: adopting a first mask process to perform a patterning process to the gate metal layer 102 in order to form the gate electrode 1021.

Figure 3B:
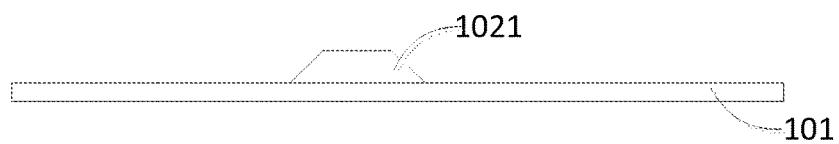

A photolithography process (such as developing, wet etching, dry etching and so on) can be adopted and through the first mask to perform a patterning process to the gate metal layer 102. At this time, after processed, the gate metal layer 102 can be a gate electrode 1021. The gate electrode 102 is a bottom gate electrode 1021, and can be located at a middle portion of the upper surface of the substrate 101, with reference to FIG. 3b.

A pattern of the bottom gate electrode 1021 from a top view includes but not limited to: linear pattern, a curve pattern, a polygonal pattern, a circular pattern, an oval pattern or star pattern and so on. It can be understood that, the specific shape of the pattern can be determined according to an actual usage, and the embodiment of the present invention is not limited here.

S2: depositing a gate insulation layer 103, a semiconductor layer 104, a source-drain metal layer 105 and a passivation layer 107 on the gate electrode 1021 and the substrate 101, and through a mask process to perform a patterning process to the semiconductor layer 104, the source-drain metal layer 105 and the passivation layer 107 in order to form a semiconductor pattern 1041, a source-drain pattern 1051 and a contact hole pattern 108.

Figure 4:
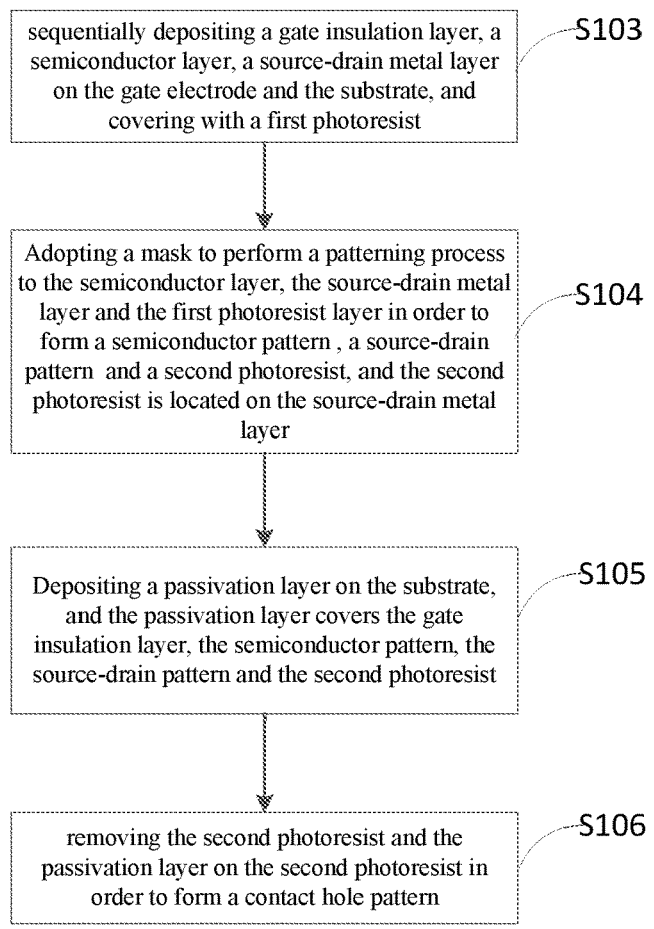
FIG. 4 is a specific flow chart of the step S2 in FIG. 1.

Specifically, as shown in FIG. 4, the step can include:

S103: sequentially depositing a gate insulation layer 103, a semiconductor layer 104, a source-drain metal layer 105 on the gate electrode 1021 and the substrate 101, and covering with a first photoresist 106.

Figure 5A:
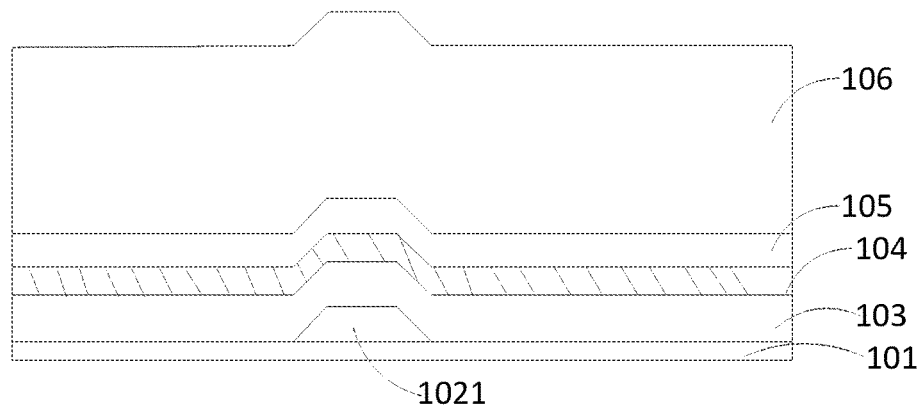
FIG. 5a-FIG. 5d is a cross-sectional view of the array substrate in each step of FIG. 4.

With reference to FIG. 5a, adopting a chemical vapor deposition to deposit the gate insulation layer 103 on the gate electrode 1021 and the substrate 101. The gate insulation layer 103 covers the gate electrode 1021, and an upper surface of the gate insulation layer 103 away from the gate electrode 1021 is a flat surface.

Then, depositing the semiconductor layer 104 on the gate insulation layer 103. Depositing a first layer of an a-Si semiconductor material (not shown in the figure) on the gate insulation layer 103. Depositing a layer of heavy-doped Si on the a-Si layer such as N+ layer in order to form the a-Si semiconductor layer 104.

Through a physical vapor deposition to form the source-drain metal layer 105 on the a-Si semiconductor layer 104. The source-drain metal layer 105 includes but not limited to aluminum, copper, cobalt, titanium, etc.

Covering with the first photoresist 106 on the source-drain metal layer 105. The photoresist is a photosensitive material. After exposing and developing, a remaining portion can protect a layer below the photoresist. Then, etching and stripping to obtain a final pattern.

S104: adopting a mask to perform a patterning process to the semiconductor layer 104, the source-drain metal layer 105 and the first photoresist layer 106 in order to form a semiconductor pattern 1041, a source-drain pattern 1051 and a second photoresist 1061, and the second photoresist 1061 is located on the source-drain metal layer 105.

Figure 5B:
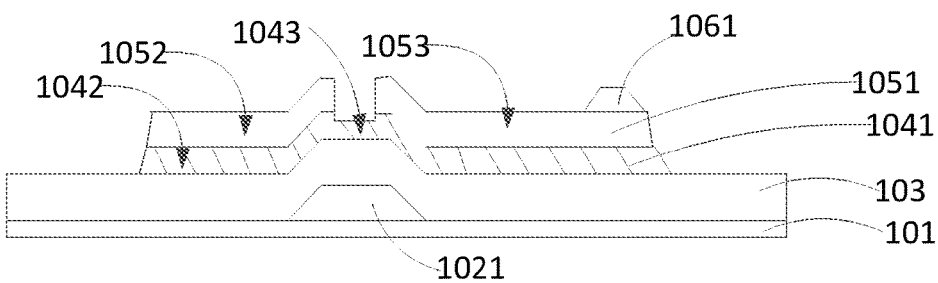

In a conventional process, forming the semiconductor pattern 1041, the source-drain pattern 1051 and the contact hole pattern 108 requires three masks. However, in the step S104, with reference to FIG. 5b, only adopting one mask to form the semiconductor pattern 1041 and the source-drain pattern 1051. Besides, the second photoresist 1061 formed after exposing and developing the first photoresist 106 can be used for the contact hole pattern 108 which will be formed subsequently. The processes are greatly reduced and the manufacturing cost is decreased.

Here, a multi-tone mask can be selected. The multi-tone mask has three or above light transmittances. After performing exposing and developing for a photoresist, the photoresist can have different thicknesses preparing for the patterning process of the semiconductor layer 104, the source-drain metal layer 105 and the first photoresist 106.

Wherein, the semiconductor pattern 1041 includes a channel 1043, a doping region 1042 and a storage capacitor (not shown in the figure), the source-drain pattern 1051 includes a source electrode 1052, a drain electrode 1503 and a data line (not shown in the figure). The second photoresist 1061 is located on the drain electrode 1053 of the source-drain pattern 1051.

Figure 5C:
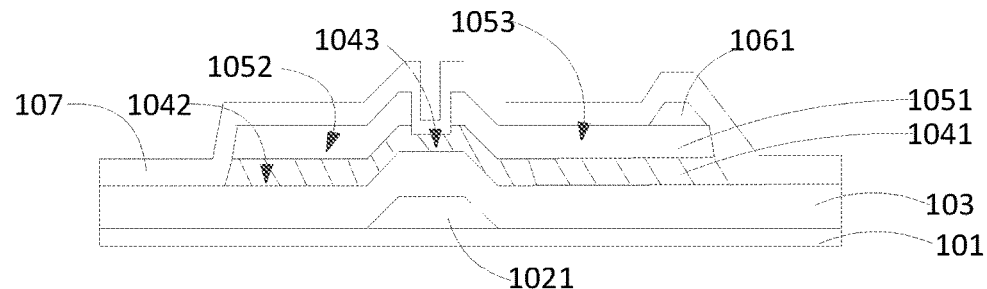

S105: depositing a passivation layer 107 on the substrate 101, and the passivation layer 107 covers the gate insulation layer 103, the semiconductor pattern 1041, the source-drain pattern 1051 and the second photoresist 1061;

With reference to FIG. 5c, adopting a chemical vapor deposition to deposit a passivation layer 107 on the substrate 101. The passivation layer 107 covers the gate insulation layer 103 which is exposed at two terminals, the source-drain pattern 1051, the channel 1043 of the semiconductor pattern 1041 and the second photoresist 1061.

S106, removing the second photoresist 1061 and the passivation layer 107 on the second photoresist 1061 in order to form a contact hole pattern 108.

Figure 5D:
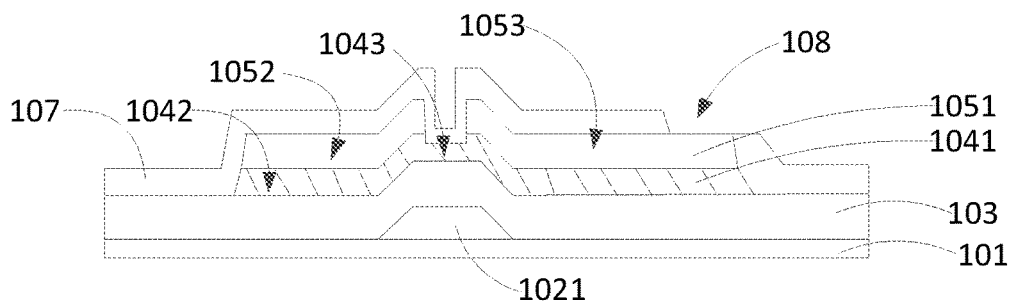

Adopting a lift-off process to remove the second photoresist 1061 and the passivation layer 107 on the second photoresist 1061. The lift-off utilizes a protruding photoresist pattern to form a protrusion at a position of the passivation layer 107 where a contact hole pattern 108 is required to be formed, and using a way that used for removing a photoresist to lift the second photoresist 1061 up, that is removing. At the same time, the passivation layer 107 on the second photoresist 1061 is also removed. A position where the second photoresist 1061 is located forms a recess. That is, forming the contact hole pattern 108, with reference to FIG. 5d.

In the process of forming the contact hole pattern 108, in order to increase the efficiency, before the second photoresist 1061 is removed, using a laser to irradiate the second photoresist 1061 such that the second photoresist 1061 is easier to be removed.

Besides, when using the lift-off process to form the contact hole pattern 108, even the contact hole pattern 108 presents an irregular phenomenon, the display effect of the array substrate will not be affected. The reason is that the contact hole pattern 108 mainly used for connecting the source and drain electrodes and the pixel electrode, and not for affecting the display effect. The sizes of the contact hole patterns 108 using the above way are similar, the poor uniformity after removing the photoresist is not existed.

S3: forming an ITO pixel electrode 110 on the contact hole pattern 108 and the passivation layer 107.

Figure 6:
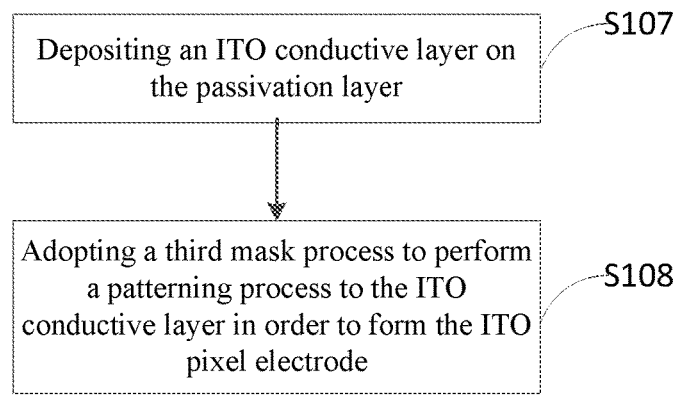
FIG. 6 is a specific flow chart of the step S3 in FIG. 1.
Figure 7A:
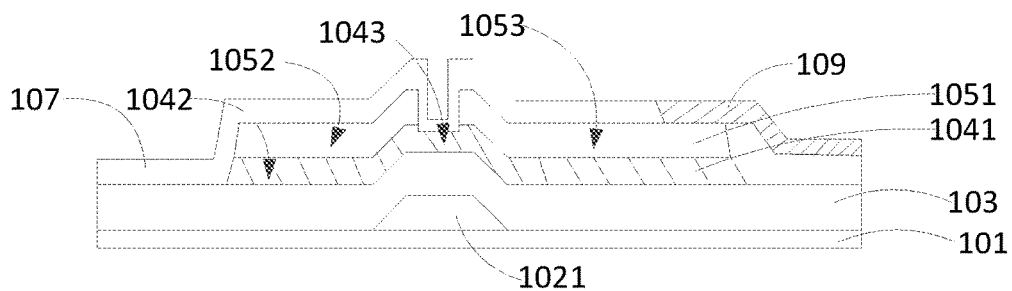
FIG. 7a-FIG. 7b is a cross-sectional view of the array substrate of each step in FIG. 6.

Specifically, as shown in FIG. 6, the step can include:

S107: depositing an ITO conductive layer 109 on the passivation layer 107;

Adopting a physical vapor deposition to deposit the ITO conductive layer 109 on the passivation layer 107, as shown in FIG. 7a.

S108: adopting a third mask process to perform a patterning process to the ITO conductive layer 109 in order to form the ITO pixel electrode 110.

Figure 7B:
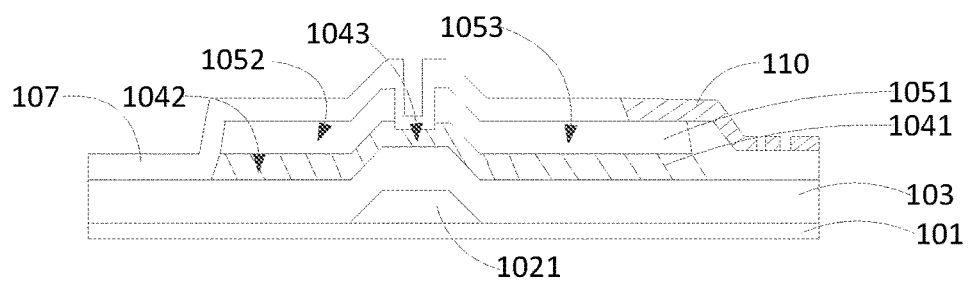

The third mask process can select a photolithography process including developing, wet etching, dry etching and so on. Through the third mask process to perform the patterning process to the ITO conductive layer 109, and the ITO conductive layer 109 after being processed can be used as a pixel electrode 110, as shown in FIG. 7b.

When patterning the ITO conductive layer 109, an edge of processed pattern should be neat, and the ITO pixel electrode 110 should be controlled in a certain width such that after assembled, the brightness of the display panel is even without generating various marks. In the present embodiment, the third mask adopts the conventional photolithography process can make the formed ITO pixel electrode 110 to obtain a same display effect as the conventional five-mask technology or four-mask technology. The problem of irregular edge, not easy to control the line width and uneven display of a pattern when using the lift-up process to manufacture the ITO pixel electrode in the conventional art is not existed.

As described above, in the first embodiment of the array substrate 110 of the present invention, through forming the gate electrode 1021 on the first substrate 101; depositing the gate insulation layer 103, the semiconductor layer 104, the source-drain metal layer 105 and the passivation layer 107 on the gate electrode 1021 and the passivation 107, through a mask process to perform a patterning process to the semiconductor layer 104, the source-drain metal layer 105 and the passivation layer 107 in order to form the semiconductor pattern 1041, the source-drain pattern 1051 and the contact hole pattern 108; forming an ITO pixel electrode 110 on the contact hole pattern 108 and the passivation layer 107. Through the above way, the present invention only uses one mask process to form the semiconductor pattern 1041, the source-drain pattern 1051 and the contact hole pattern 108 such that the process of the array substrate is reduced to three masks in order to decrease the manufacturing cost, decrease the operation time and increase the production efficiency.

Figure 8:
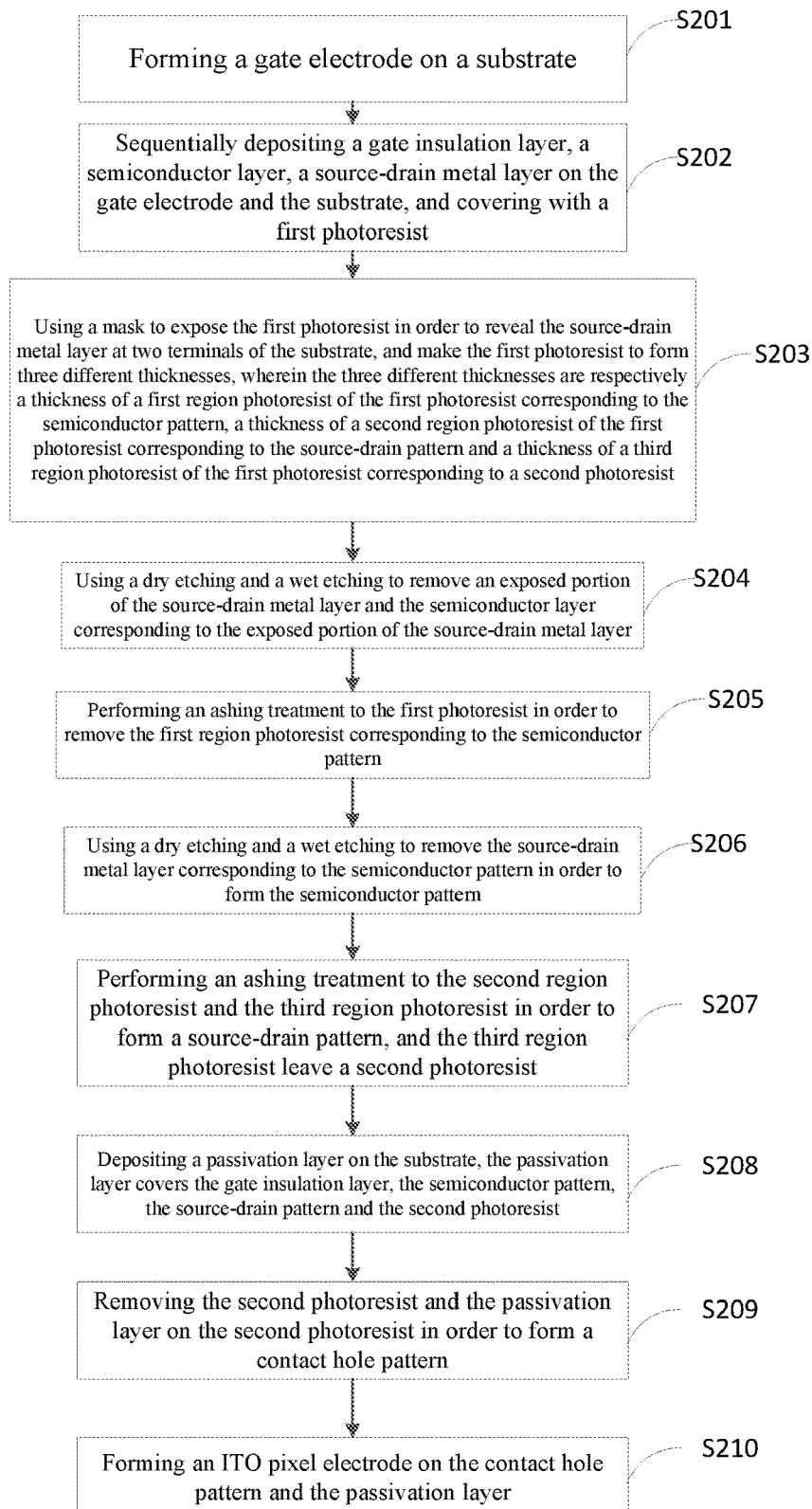
FIG. 8 is a flow chart of a second embodiment of the manufacturing method for an array substrate of the present invention.

With reference to FIG. 8, and FIG. 8 is a second embodiment of the manufacturing method for an array substrate of the present invention, FIG. 9a-FIG. 9j is a cross-sectional view of each step of the present embodiment. With reference to FIG. 8 and FIG. 9, the manufacturing method for the array substrate includes following steps:

S201: forming a gate electrode 202 on a substrate 201;

Specifically, the substrate 201 can be made by PEN (Polyethylene naphthalene), PET (Polyethylene terephthalate), PI (Polyimide) or glass.

Figure 9A:
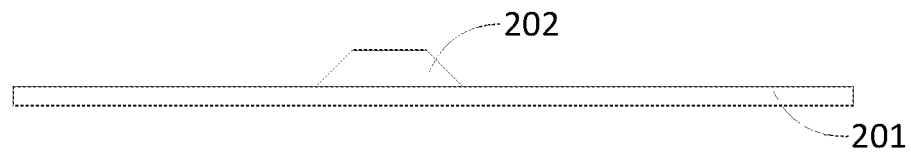
FIG. 9a-FIG. 9j is a cross-sectional view of the array substrate in each step of FIG. 8.

Through sputtering method to form a gate metal layer (not shown in the figure) on an upper surface of the substrate 201, a material of the gate metal layer 102 includes but not limited to gold, silver, copper or iron; adopting a first mask process to perform a patterning process to the gate metal layer in order to form a gate electrode 202, with reference to FIG. 9a:

S202: sequentially depositing a gate insulation layer 203, a semiconductor layer 204, a source-drain metal layer 205 on the gate electrode 202 and the substrate 201, and covering with a first photoresist 206.

Figure 9B:
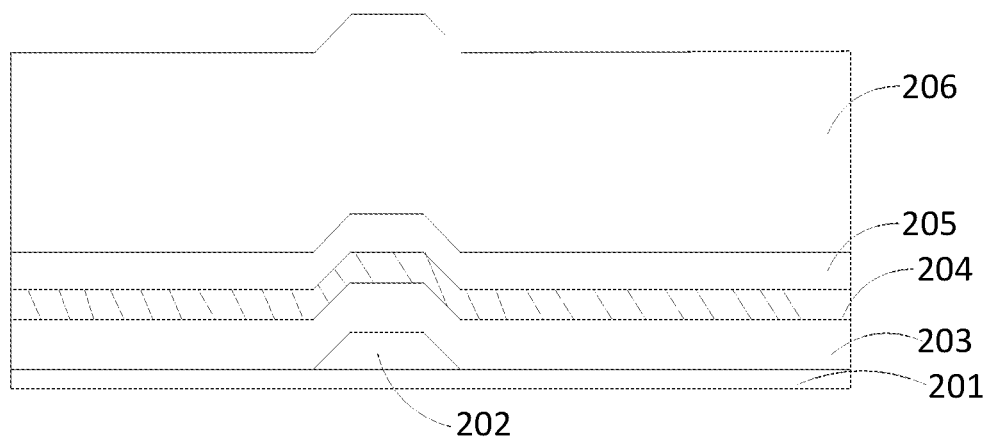

With reference to FIG. 9b, adopting a chemical vapor deposition to deposit the gate insulation layer 203 on the gate electrode 202 and the substrate 201. The gate insulation layer 203 covers the gate electrode 202, and an upper surface of the gate insulation layer 203 away from the gate electrode 202 is a flat surface.

Then, depositing the semiconductor layer 204 on the gate insulation layer 203. Depositing a first layer of an a-Si semiconductor material (not shown in the figure) on the gate insulation layer 203. Depositing a layer of heavy-doped Si on the a-Si layer such as N+ layer in order to form the a-Si semiconductor layer 204.

Through a physical vapor deposition to form the source-drain metal layer 205 on the a-Si semiconductor layer 204. The source-drain metal layer 205 includes but not limited to aluminum, copper, cobalt, titanium, etc.

Covering with the first photoresist 206 on the source-drain metal layer 205. The photoresist is a photosensitive material. After exposing and developing, a remaining portion can protect a layer below the photoresist. Then, etching and stripping to obtain a final pattern.

S203: using a mask 30 to expose the first photoresist 206 in order to reveal the source-drain metal layer 205 at two terminals of the substrate 201, and make the first photoresist 206 to form three different thicknesses, wherein the three different thicknesses are respectively a thickness of a first region photoresist 2061 of the first photoresist 206 corresponding to the semiconductor pattern 2041, a thickness of a second region photoresist 2062 of the first photoresist 206 corresponding to the source-drain pattern 2051 and a thickness of a third region photoresist 2063 of the first photoresist 206 corresponding to a second photoresist 2064.

Figure 9C:
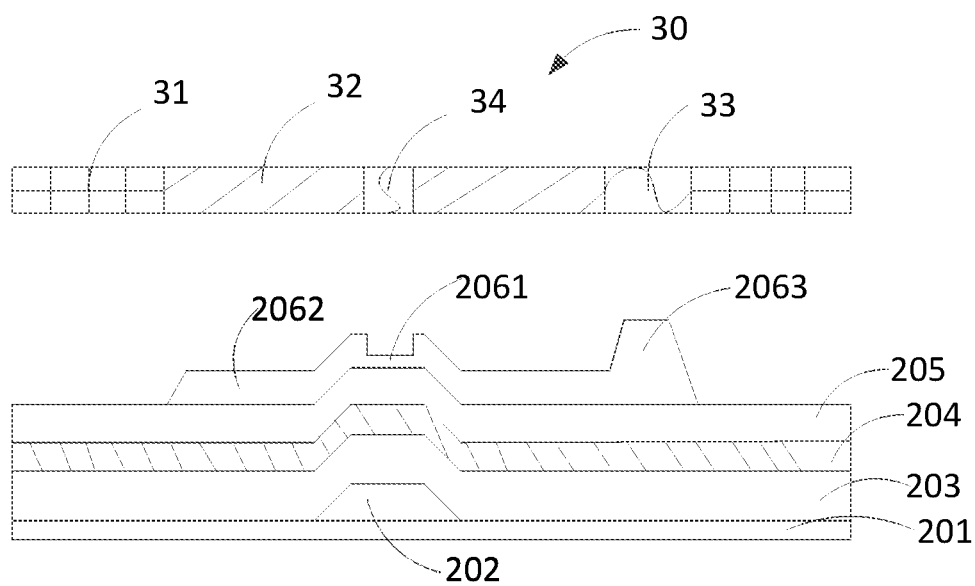

With reference to FIG. 9c, the mask 30 is a multi-tone mask 30, and the multi-tone mask 30 has four different light transmittances. Two terminal of the multi-tone mask 30 is a light-blocking film 31, after exposing the first photoresist 206, a region of the first photoresist 206 corresponding to the light-blocking film 31 is removed. A middle portion of the multi-tone mask 30 includes three materials 32/33/34 having different light transmittances such that after the first photoresist 206 is exposed, three different thicknesses are formed. Wherein, the thickness of the first region photoresist 2061 is smallest, the thickness of the third region photoresist 2063 is largest, and the thickness of the second region photoresist 2062 is between the thickness of the first region photoresist 2061 and the thickness of the third region photoresist 2063.

In order to illustrate, specific numbers are used for an example, not for limitation. For example, the thickness of the first region photoresist 2061 is 0.5 μm, the thickness of the second region photoresist 2062 is 1 μm, the thickness of the third region photoresist 2063 is 2.5 μm.

Figure 9D:
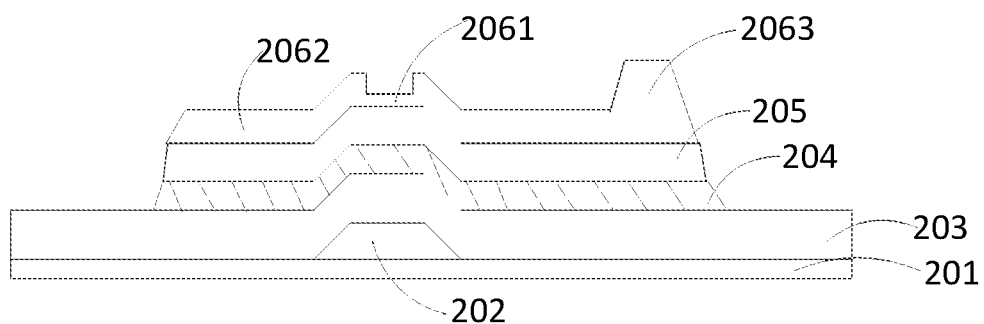

S204: using a dry etching and a wet etching to remove an exposed portion of the source-drain metal layer 205 and the semiconductor layer 204 corresponding to the exposed portion of the source-drain metal layer 205;

With reference to FIG. 9d, using a wet etching to remove the exposed portion of the source-drain metal layer 205 exposed at two terminals, and using a drying etching to remove the semiconductor layer 204 below the exposed portion of the source-drain metal layer 205 exposed at two terminals such that the gate insulation layer 203 at two terminals are exposed.

Figure 9E:
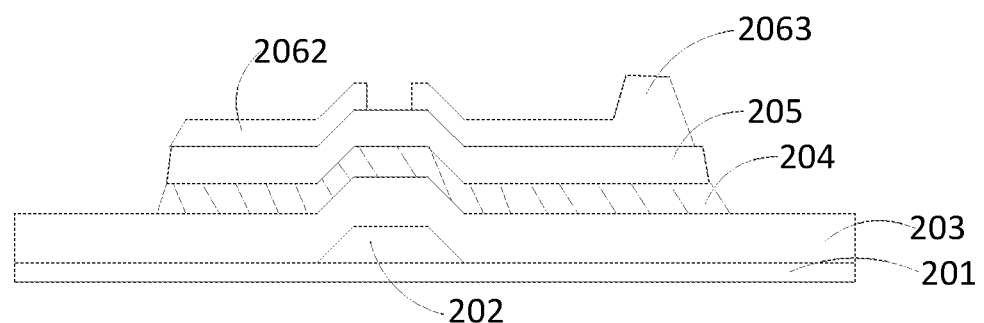

S205: performing an ashing treatment to the first photoresist 206 in order to remove the first region photoresist 2016 corresponding to the semiconductor pattern 2041;

With reference to FIG. 9e, through oxygen to burn the photoresist in order to perform the ashing treatment to the first photoresist 206 having three different thicknesses to remove the first region photoresist 2061, a removing thickness is 0.5 μm. Therefore, after removing, a remained thickness of the second region photoresist 2062 is 0.5 μm, and a remained thickness of the third region photoresist 2063 is 2 μm.

Figure 9F:
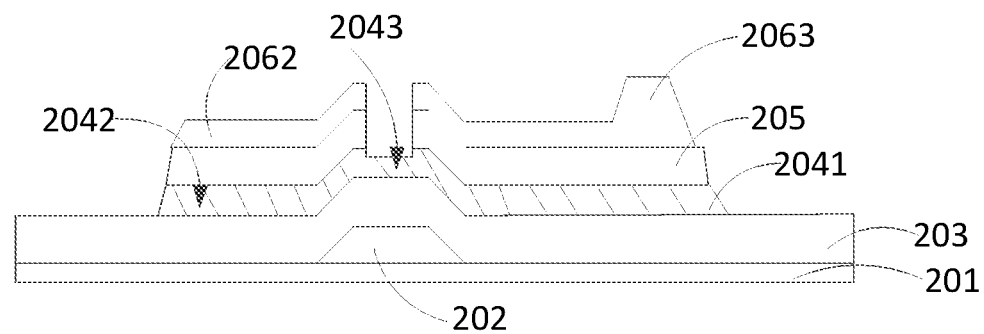

S206: using a dry etching and a wet etching to remove the source-drain metal layer 205 corresponding to the semiconductor pattern 2041 in order to form the semiconductor pattern 2041;

With reference to FIG. 9f, using a dry etching and a wet etching to remove the source-drain metal layer 205 located below the first region photoresist 2061, and removing the heavy-doped Si layer below the source-drain metal layer at the same time in order to reveal a channel 2043 and a doping region 2042 to form the semiconductor pattern 2041. The semiconductor pattern 2041 includes the channel 2043, the doping region 2042 and a storage capacitor (not shown in the figure).

Figure 9G:
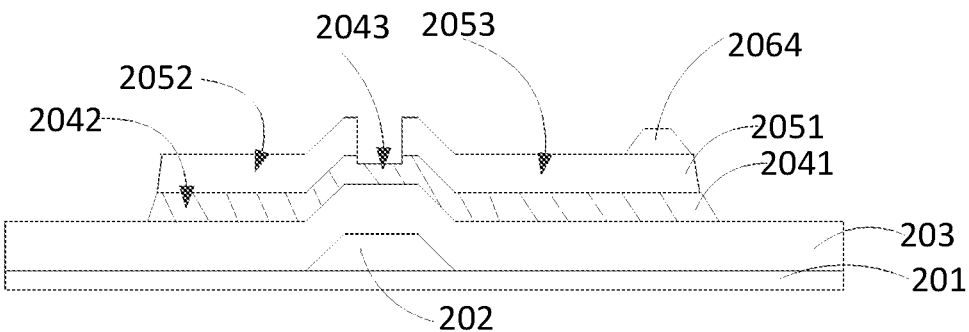

S207: performing an ashing treatment to the second region photoresist 2062 and the third region photoresist 2063 in order to form a source-drain pattern 2051, and the third region photoresist 2063 leave a second photoresist 2064;

With reference to FIG. 9g, using the oxygen to burn the photoresist in order to perform the ashing treatment to the second region photoresist 2062 and the third region photoresist 2063 in order to form the source-drain pattern 2051, and the source-drain pattern includes a source electrode 2052, a drain electrode 2053 and a data line (not shown in the figure).

The thickness of the second region photoresist 2062 is removed by 0.5 μm, therefore, a remaining thickness of the third region photoresist 2063 is 1.5 μm. A remaining portion of the third region photoresist 2063 is called as the second photoresist 2064, and the second photoresist 2064 is located on the drain electrode 2053 of the source-drain pattern 2051.

Figure 9H:
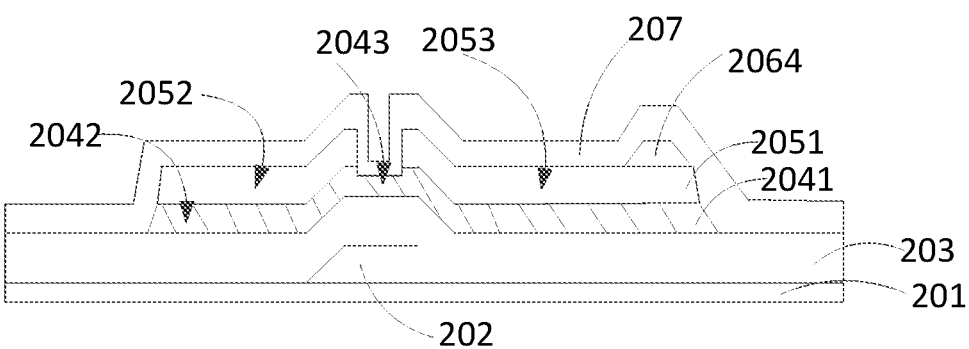

S208: depositing a passivation layer 207 on the substrate 201, the passivation layer 207 covers the gate insulation layer 203, the semiconductor pattern 2041, the source-drain pattern 2051 and the second photoresist 2064;

With reference to FIG. 9h, adopting a chemical vapor deposition to deposit a passivation layer 207 on the substrate 201. The passivation layer 207 covers the gate insulation layer 203 which is exposed at two terminals, the source-drain pattern 2051, the channel 2043 of the semiconductor pattern 2041 and the second photoresist 2064.

S209: removing the second photoresist 2064 and the passivation layer 207 on the second photoresist 2061 in order to form a contact hole pattern 208.

Figure 9I:
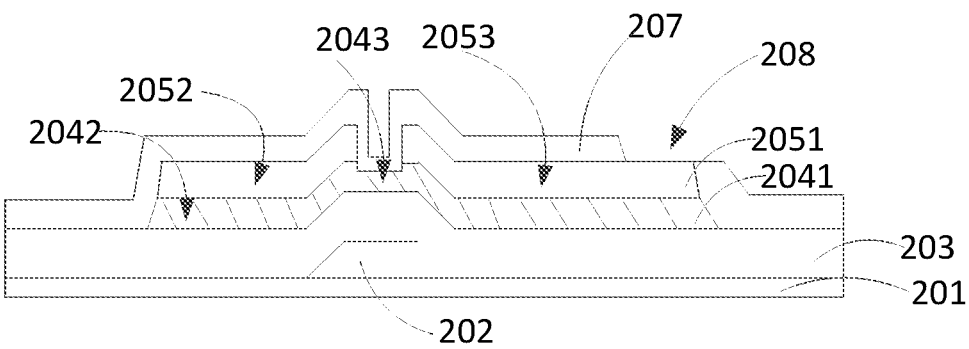

With reference to FIG. 9i, adopting a lift-off process to remove the second photoresist 2061 and the passivation layer 207 on the second photoresist 2064. The lift-off utilizes a protruding photoresist pattern to form a protrusion at a position of the passivation layer 207 where a contact hole pattern 208 is required to be formed, and using a way that used for removing a photoresist to lift the second photoresist 2064 up, that is removing. At the same time, the passivation layer 207 on the second photoresist 2064 is also removed. A position where the second photoresist 2064 is located forms a recess. That is, forming the contact hole pattern 208.

In the process of forming the contact hole pattern 208, in order to increase the efficiency, before the second photoresist 2064 is removed, using a laser to irradiate the second photoresist 2064 such that the second photoresist 2064 is easier to be removed.

Besides, when using the lift-off process to form the contact hole pattern 208, even the contact hole pattern 208 presents an irregular phenomenon, the display effect of the array substrate will not be affected. The reason is that the contact hole pattern 208 mainly used for connecting the source and drain electrodes and the pixel electrode, and not for affecting the display effect. The sizes of the contact hole patterns 208 using the above way are similar, the poor uniformity after removing the photoresist is not existed.

S210: forming an ITO pixel electrode 209 on the contact hole pattern 208 and the passivation layer 207.

Figure 9J:
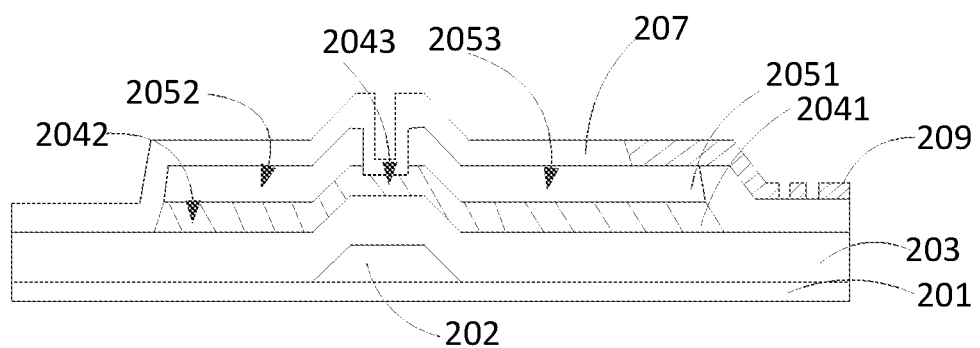

With reference to FIG. 9j, adopting a physical vapor deposition to deposit the ITO conductive layer (not shown in the figure) on the passivation layer 207, using a third mask process to performing a patterning process to the ITO conductive layer in order to form the ITO pixel electrode 209.

The third mask process can select a photolithography process including developing, wet etching, dry etching and so on. Through the third mask process to perform the patterning process to the ITO conductive layer, and the ITO conductive layer after being processed can be used as a pixel electrode 209.

As discussed above, in the present embodiment, through a first mask process to form a gate electrode 202 on the substrate 201, through a second mask process to perform a patterning process to the semiconductor layer 204, the source-drain metal layer and the passivation layer 207 in order to form the semiconductor pattern 2041, the source-drain pattern, and the contact hole pattern 208, through a third mask process to form the ITP pixel electrode 209 and finally, finishing the manufacturing for the array substrate. Through above way, the process of the array substrate is reduced to three masks in order to reduce the manufacturing cost, reduce the operation time and increase the production efficiency.

Figure 10:
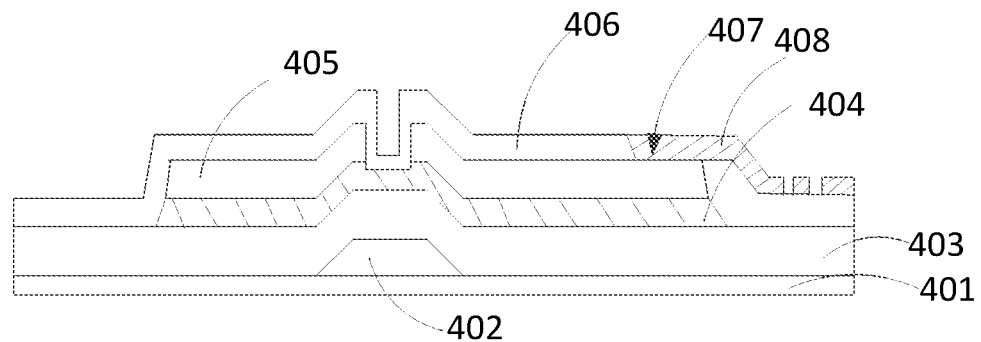
FIG. 10 is a cross-sectional view of a first embodiment of the array substrate of the present invention.

As shown in FIG. 10, a first embodiment of the array substrate of the present invention, including:

a substrate 401 and a gate electrode 402 formed on the substrate 401;

a gate insulation layer 403, a semiconductor layer 404, a source-drain metal layer 405 and a passivation layer 406 formed on the gate electrode 402 and the substrate 401, and a semiconductor pattern 404, a source-drain pattern 405 and a contact hole pattern 407 formed through a mask process; and an ITO pixel electrode 408 formed on the contact hole pattern 407 and the passivation layer 406.

The second embodiment of the array substrate of the present invention provides a display panel, including an array substrate in anyone of the above embodiments.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for an array substrate, comprising:

forming a gate electrode on a substrate;

depositing a gate insulation layer, a semiconductor layer, a source-drain metal layer and a passivation layer on the gate electrode and the substrate, and through a mask process to perform a patterning process to the semiconductor layer, the source-drain metal layer and the passivation layer in order to form a semiconductor pattern, a source-drain pattern and a contact hole pattern; and forming an ITO pixel electrode on the passivation layer and the contact hole pattern;

wherein the step of depositing a gate insulation layer, a semiconductor layer, a source-drain metal layer and a passivation layer on the gate electrode and the substrate, and through a mask process to perform a patterning process to the semiconductor layer, the source-drain metal layer and the passivation layer in order to form a semiconductor pattern, a source-drain pattern and a contact hole pattern comprises:

sequentially depositing a gate insulation layer, a semiconductor layer, a source-drain metal layer on the gate electrode and the substrate, and covering with a first photoresist;

adopting a mask to perform a patterning process to the semiconductor layer, the source-drain metal layer and the first photoresist layer in order to form a semiconductor pattern, a source-drain pattern and a second photoresist, and the second photoresist is located on the source-drain metal layer;

depositing a passivation layer on the substrate, and the passivation layer covers the gate insulation layer, the semiconductor pattern, the source-drain pattern and the second photoresist; and removing the second photoresist and the passivation layer on the second photoresist in order to form a contact hole pattern; and wherein the step of adopting a mask to perform a patterning process to the semiconductor layer, the source-drain metal layer and the first photoresist layer in order to form a semiconductor pattern, a source-drain pattern and a second photoresist comprises:

using a mask to expose the first photoresist in order to reveal the source-drain metal layer at two terminals of the substrate, and make the first photoresist to form three different thicknesses, wherein the three different thicknesses are respectively a thickness of a first region photoresist of the first photoresist corresponding to the semiconductor pattern, a thickness of a second region photoresist of the first photoresist corresponding to the source-drain pattern and a thickness of a third region photoresist of the first photoresist corresponding to a second photoresist;

using a dry etching and a wet etching to remove an exposed portion of the source-drain metal layer and the semiconductor layer corresponding to the exposed portion of the source-drain metal layer;

performing an ashing treatment to the first photoresist in order to remove the first region photoresist corresponding to the semiconductor pattern;

using a dry etching and a wet etching to remove the source-drain metal layer corresponding to the semiconductor pattern in order to form the semiconductor pattern; and performing an ashing treatment to the second region photoresist and the third region photoresist in order to form a source-drain pattern, and the third region photoresist leaves the second photoresist.

2. The method according to claim 1, wherein, the mask is a multi-tone mask, and the multi-tone mask 30 has four different light transmittances.

3. The method according to claim 2, wherein, a light transmittance of a first portion of the multi-tone mask corresponding to a first region photoresist is less than a light transmittance of a second portion of the multi-tone mask corresponding to the second region photoresist; the light transmittance of a second portion of the multi-tone mask corresponding to the second region photoresist is less than a light transmittance of a third portion of the multi-tone mask corresponding to the third region photoresist; a remaining portion of the multi-tone mask that is a portion of the multi-tone mask except the first portion, the second portion and the third portion is a light-blocking film.

4. The method according to claim 1 wherein, before the step of removing the second photoresist and the passivation layer on the second photoresist in order to form a contact hole pattern, the method further comprises:
using a laser to irradiate the second photoresist.

5. The method according to claim 1, wherein, the step of removing the second photoresist and the passivation layer on the second photoresist in order to form a contact hole pattern includes:
adopting a lift-off process to remove the second photoresist and the passivation layer on the second photoresist in order to form a contact hole pattern.

6. The method according to claim 1, wherein, the step of sequentially depositing a gate insulation layer, a semiconductor layer, a source-drain metal layer on the gate electrode and the substrate comprises:
adopting a chemical vapor deposition to sequentially deposit the gate insulation layer and the semiconductor layer on the gate electrode and the substrate; and
adopting a physical vapor deposition to deposit the source-drain metal layer on the semiconductor layer.

7. The method according to claim 6, wherein, the step of adopting a chemical vapor deposition to sequentially deposit the gate insulation layer and the semiconductor layer on the gate electrode and the substrate includes:
adopting a chemical vapor deposition to deposit an a-Si layer on the gate electrode and the substrate; and
doping the a-Si layer in order to form a doped a-Si layer.

8. The method according to claim 6, wherein, the doped a-Si layer is an N+ doped a-Si layer.

9. The method according to claim 1, wherein, the step of forming an ITO pixel electrode on the passivation layer and the contact hole pattern comprises:
depositing an ITO conductive layer on the passivation layer; and
adopting a third mask process to perform a patterning process to the ITO conductive layer in order to form the ITO pixel electrode.

10. The method according to claim 9, wherein, the step of depositing an ITO conductive layer on the passivation layer comprises:
adopting a physical vapor deposition to deposit the ITO conductive layer on the passivation layer.

11. The method according to claim 9, wherein, the third mask process is a photolithography process including developing, wet etching, and dry etching.

12. The method according to claim 1, wherein, the step of forming a gate electrode on a substrate comprises:
forming a gate metal layer on the substrate; and
using a first mask process to perform a patterning process to the gate metal layer to form the gate electrode.

13. The method according to claim 12, wherein,
a material of the gate metal layer includes gold, silver, copper or iron.

14. The method according to claim 12, wherein,
the first mask process is a photolithography process including developing, wet etching, and dry etching.

* * * * *